US 7,681,456 B2

(12) United States Patent
Hausler

(10) Patent No.: US 7,681,456 B2
(45) Date of Patent: Mar. 23, 2010

(54) FIELD DEVICE INCLUDING A CAPILLARY TUBE HAVING A NON-CYLINDRICAL LUMEN

(75) Inventor: George Hausler, Maple Grove, MN (US)

(73) Assignee: Rosemount Inc., Eden Prairie, MN (US)

( * ) Notice: Subject to any disclaimer, the term of this patent is extended or adjusted under 35 U.S.C. 154(b) by 0 days.

(21) Appl. No.: 12/142,919

(22) Filed: Jun. 20, 2008

(65) Prior Publication Data

US 2009/0314093 A1    Dec. 24, 2009

(51) Int. Cl.
*G01L 9/00* (2006.01)
(52) U.S. Cl. ........................................................ 73/717
(58) Field of Classification Search ............ 73/700–756
See application file for complete search history.

(56) References Cited

U.S. PATENT DOCUMENTS

| 4,157,909 | A | 6/1979 | Kachidurian | 65/269 |
| 4,513,190 | A | 4/1985 | Ellett et al. | 219/56.21 |
| 4,733,563 | A | 3/1988 | Nava et al. | 73/706 |
| 4,832,070 | A | 5/1989 | James et al. | 137/65 |
| 4,842,825 | A | 6/1989 | Martin et al. | 422/80 |
| 5,226,728 | A | 7/1993 | Vander Heyden | 374/36 |
| 6,089,097 | A | 7/2000 | Frick et al. | 73/718 |
| 6,487,912 | B1 | 12/2002 | Behm et al. | 73/753 |
| 6,898,980 | B2 | 5/2005 | Behm et al. | 73/756 |
| 7,287,432 | B2 | 10/2007 | Schnaare et al. | 73/706 |
| 2006/0162459 | A1* | 7/2006 | Broden | 73/715 |
| 2007/0151352 | A1 | 7/2007 | Lange | 73/736 |
| 2007/0183108 | A1 | 8/2007 | Uhlenberg et al. | 361/91.1 |
| 2008/0245152 | A1* | 10/2008 | Louwagie et al. | 73/706 |

FOREIGN PATENT DOCUMENTS

DE    103 14 920 A1    10/2004

OTHER PUBLICATIONS

"Notification of Transmittal of the International Search Report and the Written Opinion" from corresponding application PCT/US2009/003579, dated Nov. 23, 2009.

* cited by examiner

*Primary Examiner*—Andre J Allen
(74) *Attorney, Agent, or Firm*—Westman, Champlin & Kelly, P.A.

(57) ABSTRACT

In a particular embodiment, a field device is disclosed that includes a housing defining a fluid cavity and a sensor cavity and having an isolation barrier to isolate the fluid cavity from the sensor cavity. The field device further includes a pressure sensor disposed within the sensor cavity. The pressure sensor includes at least one pressure inlet. The field device also includes a capillary tube extending from the at least one pressure inlet to the fluid cavity through the isolation barrier. The capillary tube includes a lumen having a non-cylindrical shape.

20 Claims, 6 Drawing Sheets

FIELD DEVICE INCLUDING A CAPILLARY TUBE HAVING A NON-CYLINDRICAL LUMEN

FIELD OF THE DISCLOSURE

The present disclosure is generally related to a field device and method of manufacturing a field device including a capillary tube having a non-cylindrical lumen.

BACKGROUND

Industrial processes are used to manufacture various products such as refined oil, pharmaceuticals, paper, foods, other products, or any combination thereof. Such industrial processes are typically controlled using process monitoring and control systems, which use multiple field devices (i.e., process sensors, process actuators, and other electronic devices) to monitor and control operation of the industrial processes. In general, field devices are electronic devices that can be coupled to process equipment to sense a process parameter and to communicate data related to the sensed process parameter to a control system. Such process parameters can include pressure, temperature, fluid flow rate, other process parameters, or any combination thereof. Further, field devices can include actuator circuitry that can be controlled by the control system to adjust a parameter, for example, by adjusting a valve.

One type of field device can be referred to as a pressure transmitter. A pressure transmitter can be coupled to industrial equipment to measure a pressure associated with a process fluid (such as a gas, a liquid, or any combination thereof) and can communicate data related to the measured pressure to a control system, either via a wire or via a wireless communication protocol. Pressure transmitters can be used to measure differential, absolute, or gauge pressures. Further, using known techniques, pressure transmitters can be used to measure flows of the process fluid based upon a pressure differential in the process fluid between two locations.

Typically, a pressure transmitter includes a pressure sensor, which is coupled to a process fluid via an isolation system. The isolation system can include an isolating diaphragm that physically contacts the process fluid. Further, the isolation system can include an isolation fill fluid that extends between the isolation diaphragm and the pressure sensor. The isolation fill fluid is a substantially incompressible fluid such as an oil. As the process fluid exerts a pressure on the isolation diaphragm, changes in the applied pressure are conveyed across the diaphragm and through the isolation fluid to the pressure sensor. Such isolation systems prevent the delicate components of the pressure sensor from being directly exposed to the process fluid and to heat associated with the process fluid.

In flammable environments, a capillary tube is configured to convey the isolation fill fluid between the diaphragm and the sensor. If the diaphragm ruptures, the capillary tube is intended to prevent flames from extending from within the housing through the capillary tube. The International Electrotechnical Commission (IEC) has promulgated an acceptable flame-path configuration for a round shaft that extends through a hole in an enclosure, where the gap between the shaft and the hole is approximately 0.008 inches or less around the circumference of the shaft and where the wall thickness of the enclosure is approximately 0.375 inches or more. The accepted flame path configuration is defined an IEC document number 60079-1 (2003). However, a capillary tube having a cylindrical lumen with a diameter of approximately 0.008 inches can result in delayed pressure measurements from the sensor, because reduced diameter of the capillary tube may impede the flow of the isolation fluid fill due to the viscosity of the isolation fluid fill. Such delayed pressure measurements can result in delayed process control signals, which may delay transmission of control signals to alter a process, resulting in damage to the process equipment.

SUMMARY

In a particular embodiment, a field device includes a housing defining a fluid cavity, a sensor cavity, and an isolation barrier to isolate the fluid cavity from the sensor cavity. The field device further includes a pressure sensor disposed within the sensor cavity and having at least one pressure inlet. A capillary tube extends from the at least one pressure inlet to the fluid cavity through the isolation barrier. The capillary tube includes a lumen having a non-cylindrical shape.

In another particular embodiment, a method includes forming a housing base adapted to couple to process equipment. The housing base includes a sensor cavity and a fluid cavity separated by an isolation barrier. The housing base further includes a capillary tube that defines a lumen having a non-cylindrical shape. The capillary tube extends from the fluid cavity to the sensor cavity through the isolation barrier. The method further includes attaching a deformable diaphragm to the housing base over the fluid cavity, filling the fluid cavity with a fill fluid, and coupling a sensor circuit to the capillary tube within the sensor cavity, the sensor circuit adapted to detect a process fluid pressure based on a deformation of the deformable diaphragm via the fill fluid.

In still another particular embodiment, a process control device includes a transmitter housing defining a sensor cavity and a fluid cavity separated by an isolation barrier. The process control device further includes a capillary tube. The capillary tube includes a lumen having a non-cylindrical shape. The capillary tube extends from the fluid cavity to the sensor cavity through the isolation barrier and is adapted to prevent a flame from traversing a length of the capillary tube. The process control device further includes a deformable diaphragm coupled to the transmitter housing over the fluid cavity, a fill fluid disposed within the fluid cavity, and a sensor circuit disposed within the sensor cavity. The sensor circuit is coupled to the capillary tube to sense a process fluid pressure based on a deformation of the deformable diaphragm.

DETAILED DESCRIPTION OF ILLUSTRATIVE EMBODIMENTS

Figure 1:
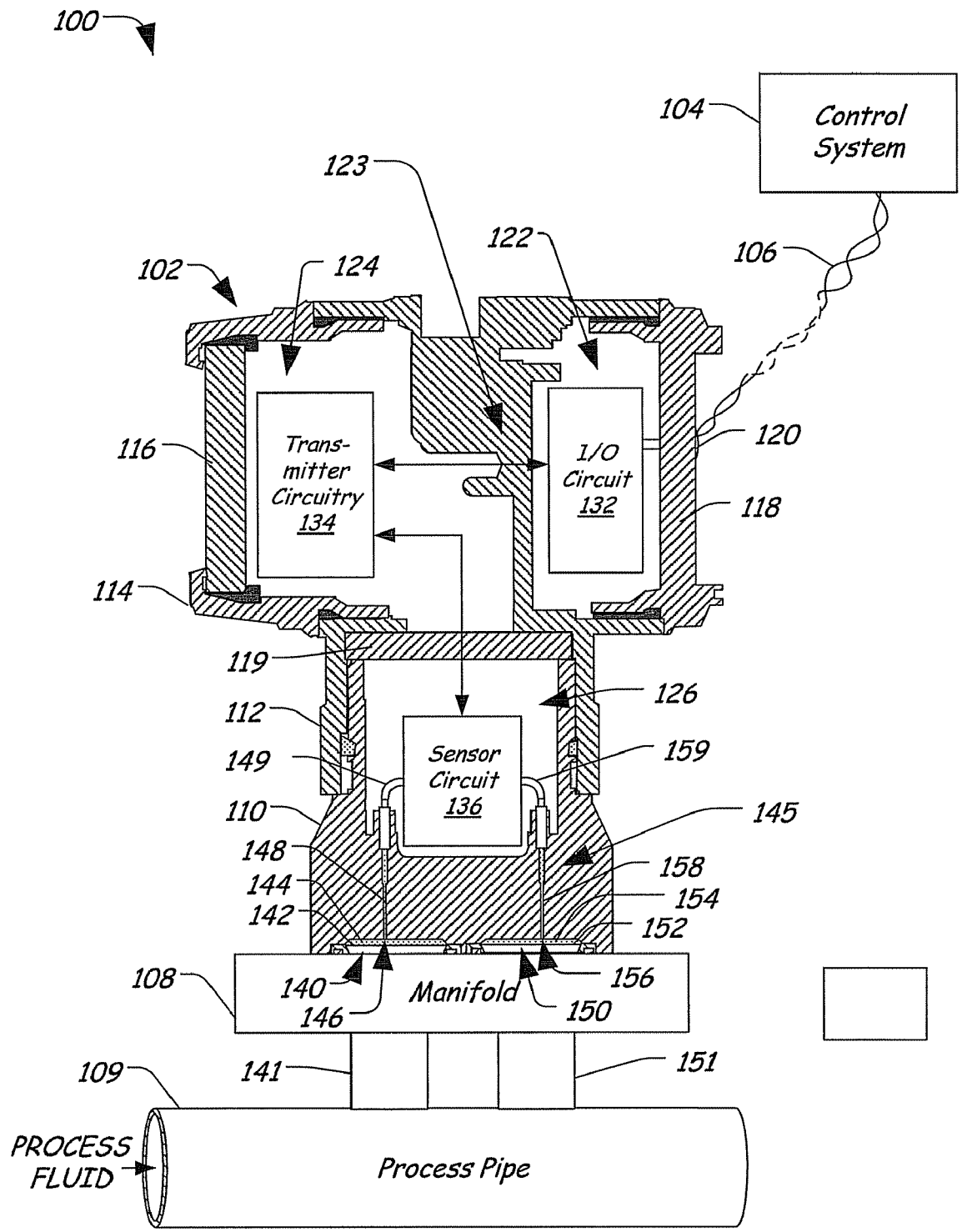
FIG. 1 is a diagram of a particular illustrative embodiment of a process control system including a field device having a capillary tube with a non-cylindrical lumen.

FIG. 1 is a diagram of a particular illustrative embodiment of a process control system 100 including a field device 102 that communicates with a control system 104 via wiring 106. In an alternative embodiment, the field device 102 may include a wireless transceiver to communicate with the control system 104 via a wireless communications link. The field device 102 is illustrated in a partial cross-sectional view. The field device 102 is coupled to a manifold 108 (or other attachment mechanism) via a base housing portion 110. In a particular embodiment, the manifold 108 may be coupled to a pipe 109 via a first line 141 and a second line 151. In another particular example, the manifold 108 or another attachment feature, such as a clamp, may couple the field device 102 to a wall of a reservoir, to a wall associated with other equipment, or any combination thereof. In a particular embodiment, the field device 102 and the manifold 108 may be located at a distance from the process pipe 109 and may be connected to the process pipe 109 via the first and second lines 141 and 151.

The field device 102 includes the base housing portion 110, which is threadably attached to an upper housing portion 112. The base housing portion 110 defines a sensor cavity 126, a first fluid cavity 144 and a second fluid cavity 154. The sensor cavity 126 is isolated from the first and second fluid cavities 144 and 154 by a first isolation barrier 145.

The field device 102 further includes a transmitter housing portion 114 and an input interface portion 118 that are threadably attached to the upper housing portion 112. The upper housing portion 112 and the transmitter housing portion 114 define a transmitter cavity 124. The transmitter housing portion 114 further includes a transmitter cover 116, which is adapted to protect transmitter circuitry 134 from a process environment. The input interface 118 includes one or more fasteners 120 for coupling to wiring 106. The input interface 118 and the upper housing portion 112 define an input/output interface cavity 122 that includes an input/output interface circuit 132. The input/output interface cavity 122 is isolated from the transmitter cavity 124 by a second isolation barrier 123. The input/output interface circuit 132 is coupled to the input interface 118 and to the transmitter circuitry 134 and is adapted to communicate data between the transmitter circuitry 132 and the control system 104.

The sensor cavity 126 is isolated from the transmitter circuit cavity 124 and from the input/output interface cavity 122 by a third isolation barrier 119. The sensor cavity 126 is adapted to secure a sensor circuit 136, such as a pressure sensor.

The field device 102 includes a first pressure interface 140 and a second pressure interface 150. The first pressure interface 140 includes a first diaphragm 142 having a first isolation surface that contacts a process fluid received via the manifold 108 and the first line 141 and a first fluid cavity surface that contacts an isolation fill fluid within the first fluid cavity 144. The first diaphragm 142 isolates the first fluid cavity 144 from the process fluid. The first pressure interface 140 further includes a first capillary tube 148 having a first non-cylindrical lumen 146 that couples the first fluid cavity 144 to a first pressure inlet 149 of the sensor circuit 136. In a particular illustrative embodiment, the first non-cylindrical lumen 146 has a non-circular cross-section. As used herein, the term "lumen" refers to the bore or fluid path within a tube or passageway, such as the first capillary tube 148.

The second pressure interface 150 includes a second diaphragm 152 having a second isolation surface that contacts the process fluid received via the manifold 108 and the second line 151 and a second fluid cavity surface that contacts isolation fill fluid within the second fluid cavity 154. The second diaphragm 152 isolates the second fluid cavity 154 from the process fluid. The second pressure interface 150 further includes a second capillary tube 158 that has a second non-cylindrical lumen 156 that couples the second fluid cavity 154 to a second pressure inlet 159 of the sensor circuit 136. In a particular embodiment, the second non-cylindrical lumen 156 has a non-circular cross-section.

In a particular embodiment, the diaphragm 142 is adapted to deform in response to a process fluid pressure, applying a compressive force to the fill fluid within the first fluid cavity 144 and the first capillary tube 148 in response to the deformation. The fill fluid is adapted to convey the process fluid pressure to the first pressure inlet 149 via the first capillary tube 148 in response to deformation of the first diaphragm 142. In a particular embodiment, the sensor circuit 136 is adapted to determine a process fluid pressure based on the deformation of the first diaphragm 142 via the fluid fill within the first capillary tube 148.

In a particular embodiment, the first and second lumens 146 and 156 may have a non-cylindrical shape (i.e., a non-circular cross-sectional shape). In a particular embodiment, a cross-section of the first and second lumens 146 and 156 may have a bean-shape, an elliptical shape, a cross shape, an S-shape, a star shape, a triangle shape, a rectangular shape, a boomerang shape, a Z-shape, an irregular shape, other non-circular shapes, or any combination thereof. In a flameproof field device, the non-cylindrical shape of the first and second lumens 146 and 156 prevent flames from traveling through the first and second capillary tubes 148 and 158 from the sensor cavity 126.

In a particular example, the first and second capillary tubes 148 and 158 are coupled to the first and second fluid cavities 144 and 154 via slots or openings that have a non-circular cross-sectional shape. In a particular embodiment, the slots or openings have the same shape as the first and second lumens 146 and 156 of the first and second capillary tubes 148 and 158. In a particular example, a first slot or opening (and the corresponding first lumen 146 of the first capillary tube 148) may have the same shape as the second slot. In another particular example, the first slot may have a different shape from the second slot.

In a particular example, the cross-sectional area of the slot may be held constant while the width and length dimensions of the slot are varied to identify a particular configuration to remain flame-proof without inhibiting flow of the fill fluid. In a particular example, the viscosity of the fill fluid may determine a desired cross-sectional area, and the shape and dimensions of the opening and the corresponding lumen may be selected to meet flame-proof standards without inhibiting the flow of the fill fluid. In a particular example, a particular fill fluid may have a desirable flow characteristic within a capillary tube having a cross-sectional lumen area of approximately 0.00038 square units. In this example, the opening may have a substantially elliptical shape and a tube length of approximately 0.375 inches or longer. In a particular instance, the opening and the corresponding lumen may have a width dimension of approximately 0.008 inches and a length dimension of approximately 0.049 inches or greater. In another particular instance, the width dimension may be adjusted, depending on the fill fluid, and the length dimension may be adjusted accordingly to maintain a desired cross-sectional area without reducing a flame-proof characteristic. In a particular example, the first and second capillary tubes 148 and 158 define respective lumens 146 and 156 having respective cross-sectional areas that are greater than or equal to approximately 0.00038 square inches, while preventing flames from traversing from the sensor cavity 126 to the first and second fluid cavities 144 and 154 via the first and second capillary tubes 148 and 158.

In another particular example, the length dimension of the slot may be smaller than 0.049 inches, and the width may be increased to a width that is within a range of approximately 0.008 inches and 0.018 inches while satisfying flameproof requirements. In a particular example, the slot can be approximately 0.0016 inches wide with a 0.0007-inch turn radius. In another particular example, the slot or opening can have a width dimension within a range from approximately 0.008 inches to approximately 0.018 inches. By making the lumen an irregular shape (i.e., non-circular cross-sectional shape or non-cylindrical shape), the dimensions of the lumen may be adjusted to allow free flow of the fill fluid without allowing flames to travel through the capillary tube.

Figure 2:
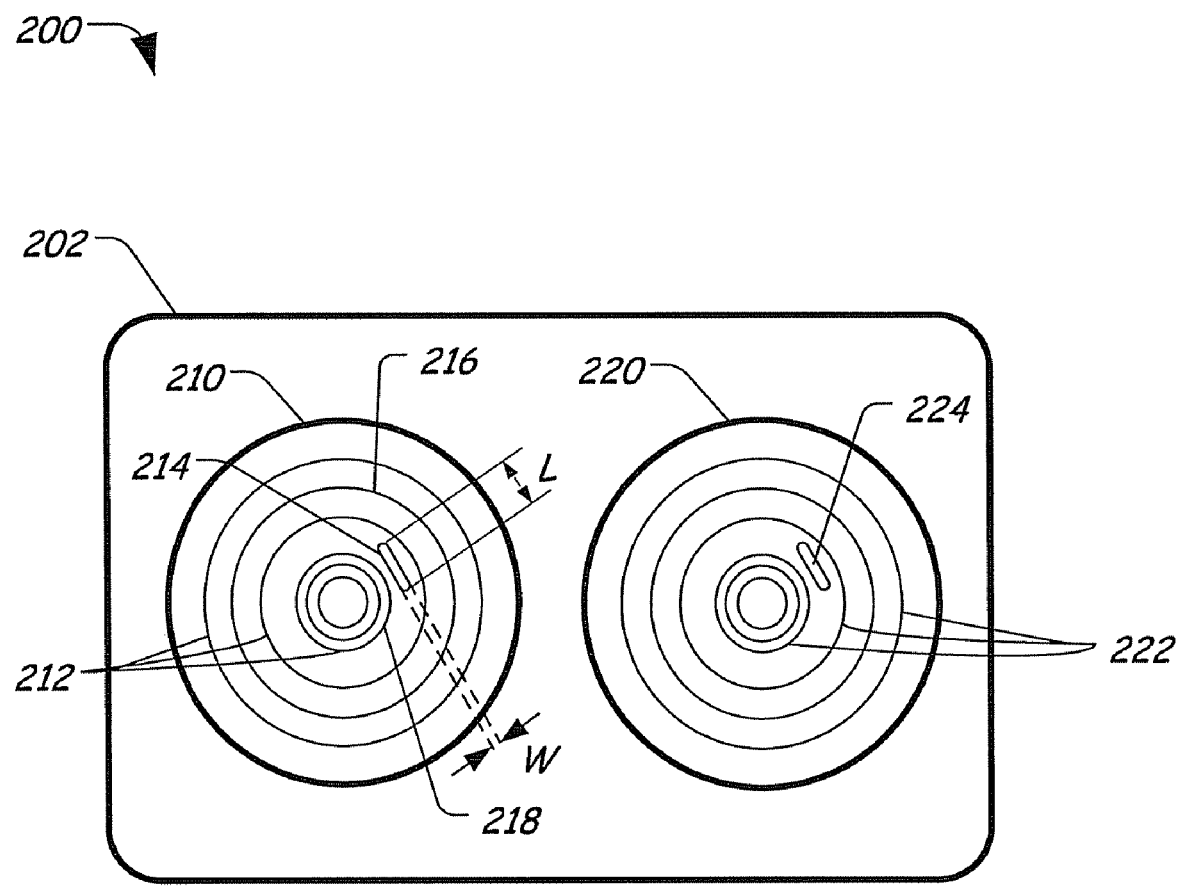
FIG. 2 is a bottom view of a particular illustrative embodiment of a fluid cavity of a field device including an ellipse-shaped opening corresponding to a lumen of a capillary tube.

FIG. 2 is a bottom view 200 of a field device 202 including a first fluid cavity 210 and a second fluid cavity 220. The first fluid cavity 210 includes a first plurality of ridges 212 and a first ellipse-shaped opening 214 that corresponds to a shape of a lumen of a first capillary tube, such as the first lumen 146 of first capillary tube 148 illustrated in FIG. 1. The second fluid cavity 220 includes a second plurality of ridges 222 and a second ellipse-shaped opening 224 that corresponds to a lumen of a second capillary tube, such as the second lumen 156 of the second capillary tube 158 illustrated in FIG. 1. First and second diaphragms, such as the first and second diaphragms 142 and 152, may be coupled to the process transmitter device 202 over the first and second fluid cavities 210 and 220. The first and second plurality of ridges 212 and 222 limit deformation of such first and second diaphragms to prevent the first and second diaphragms from deforming beyond a breaking point and from rupturing. In a particular embodiment, the first and second ellipse-shaped openings 214 and 224 are formed between ridges of the plurality of ridges 222. For example, the first ellipse-shaped opening 214 is formed between a first ridge 216 and a second ridge 218 of the plurality of ridges 212. In a particular embodiment, the shape of the first ellipse-shaped opening 214 between the first and second ridges 216 and 218 has a greater circumference than a circular shape. In an overpressure event that deforms the diaphragm sufficiently to contact the first-ellipse-shaped opening 214, the pressure is distributed along a larger circumferential area, reducing a pressure per unit area on the diaphragm, which reduces damage to the diaphragm, which might otherwise be caused by the edges of the first ellipse-shaped opening 214.

Figure 3:
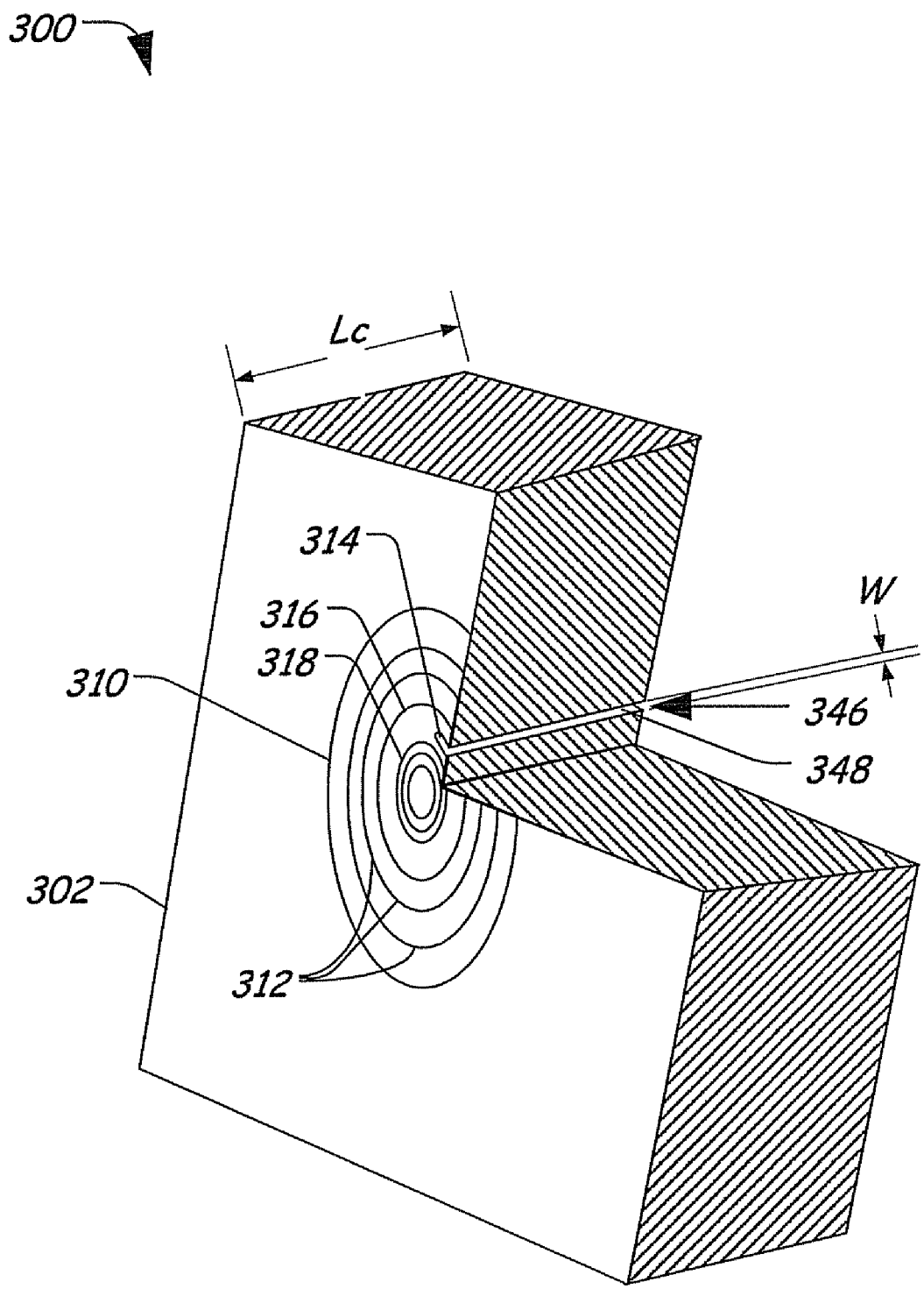
FIG. 3 is a cross-sectional view of a portion of particular illustrative embodiment of a field device illustrating a fluid cavity and a capillary tube having a non-cylindrical lumen.

In general, the first and second ellipse-shaped openings 214 and 224 correspond to an ellipse-shaped lumen of corresponding capillary tubes, such as the first and second lumens 146 and 156 of the first and second capillary tubes 148 and 158 illustrated in FIG. 1. In a particular embodiment, the first ellipse-shaped opening 214 has a cross-sectional area (A) that is defined by a length dimension (L) and a width dimension (W). Further, the capillary tube that is coupled to the first ellipse-shaped opening 214 has a corresponding cross-sectional area having the length dimension (L) and the width dimension (W). The capillary tube also has a capillary length dimension (Lc), which is illustrated in FIG. 3. A ratio of the capillary length dimension (Lc) to the cross-sectional area (A) may be maintained while the particular length and width dimensions of the first ellipse-shaped opening 214 are adjusted. In a particular example, the first ellipse-shaped opening 214 may have a cross-sectional area of approximately 0.0038 square inches, a width dimension of approximately 0.008 inches and a length dimension of approximately 0.049 inches.

By forming the capillary tube and the first ellipse-shaped opening 214 as a slot, as opposed to a round hole, the ability of a flame to traverse a specific distance within an associated capillary tube (i.e., from the sensor through the capillary tube) is reduced. In a particular example, the cross-section of the lumen of the capillary tube and the first ellipse-shaped opening 214 have a width within a range of approximately 0.008 inches to approximately 0.018 inches and a length dimension that maintains a desired cross-sectional area (A). The capillary tube may have a length (Lc) of 0.375 inches or more. In a particular example, a ratio of the desired cross-sectional area (A) to the length (Lc) of the capillary tube may be approximately $1.01 \times 10^{-3}$ (i.e., 0.00038/0.375=0.00101) or greater. Depending on a particular shape of the opening (such as the first ellipse-shaped opening 214) and of the corresponding lumen, the cross-sectional area (A) of the lumen may be increased while still preventing flames from traversing the length (Lc) of the capillary tube. Further, as the cross-sectional area of the lumen increases, the ratio may become larger, provided the length (Lc) of the capillary tube is held constant. In another particular example, the ratio may be held constant by increasing the length (Lc) of the capillary tube as the cross-sectional area (A) is increased.

FIG. 3 is a cross-sectional view of a portion of particular illustrative embodiment of a field device 300 illustrating a fluid cavity 310 and a capillary tube 348 having a non-cylindrical lumen 346. The fluid cavity 310 includes a plurality of ridges 312 including a first ridge 316 and a second ridge 318. The fluid cavity 310 further includes an ellipse-shaped opening 314 that corresponds to the shape of the lumen 346 of the capillary tube 348. The ellipse-shaped opening 314 and a cross-section of the lumen 346 have a width (W) and a length (L), as illustrated in FIG. 2. The capillary tube 348 has a length dimension (Lc).

In general, the non-cylindrical shape of the lumen 346 of the capillary tube 348 allows oil or other viscous fluids to serve as a pressure transfer medium between a diaphragm that extends over the fluid cavity 310 and a pressure sensor coupled to the other end of the capillary tube 348. The non-circular, cross-sectional shape of the lumen 346 and the corresponding shape of the ellipse-shaped opening 314 in conjunction with the cross-sectional area and the length (Lc) of the lumen 346 prevent flames from traversing the length (Lc) of the capillary tube 148. In a particular embodiment, the non-circular, cross-sectional shape of the lumen (i.e., the non-cylindrical shape of the lumen) allows the cross-sectional area of the lumen 346 of the capillary tube 348 to be increased to enhance a responsiveness of the sensor while maintaining flame protection.

In a particular example, a ratio of the capillary length (Lc) (i.e., approximately 0.375 inches) relative to the cross-sectional area (A) of the lumen 346 of the capillary tube 348 (i.e., approximately 0.0038 square inches) is approximately 986.8. In a particular example, the cross-sectional area (A) of the lumen 346 and the length of the capillary tube 348 may be held constant, and the shape, width dimension, and length dimension of the opening and the corresponding lumen 346 may be varied.

It should be understood that tests may reveal that particular shapes of the lumen may allow for different cross-sectional areas and different capillary length dimensions while remaining flameproof. In a particular example, a bean-shaped lumen may allow for a cross-sectional larger cross-sectional area of the lumen 346 while maintaining a flame-proof characteristic. In another particular example, a cross-sectional area of the lumen 346 of the capillary tube 348 may be increased using other non-cylindrical (i.e., non-circular cross-sectional shapes), such as star shapes, cross-shapes, or other shapes. In another particular example, the actual width and length of a particular opening and the cross-sectional area of the corresponding lumen may vary based on the viscosity of the fill fluid. Further, particular dimensions for a particular capillary tube having a non-cylindrical shape (i.e., a cross-sectional shape that is non-circular) can be determined by testing.

Figure 4:
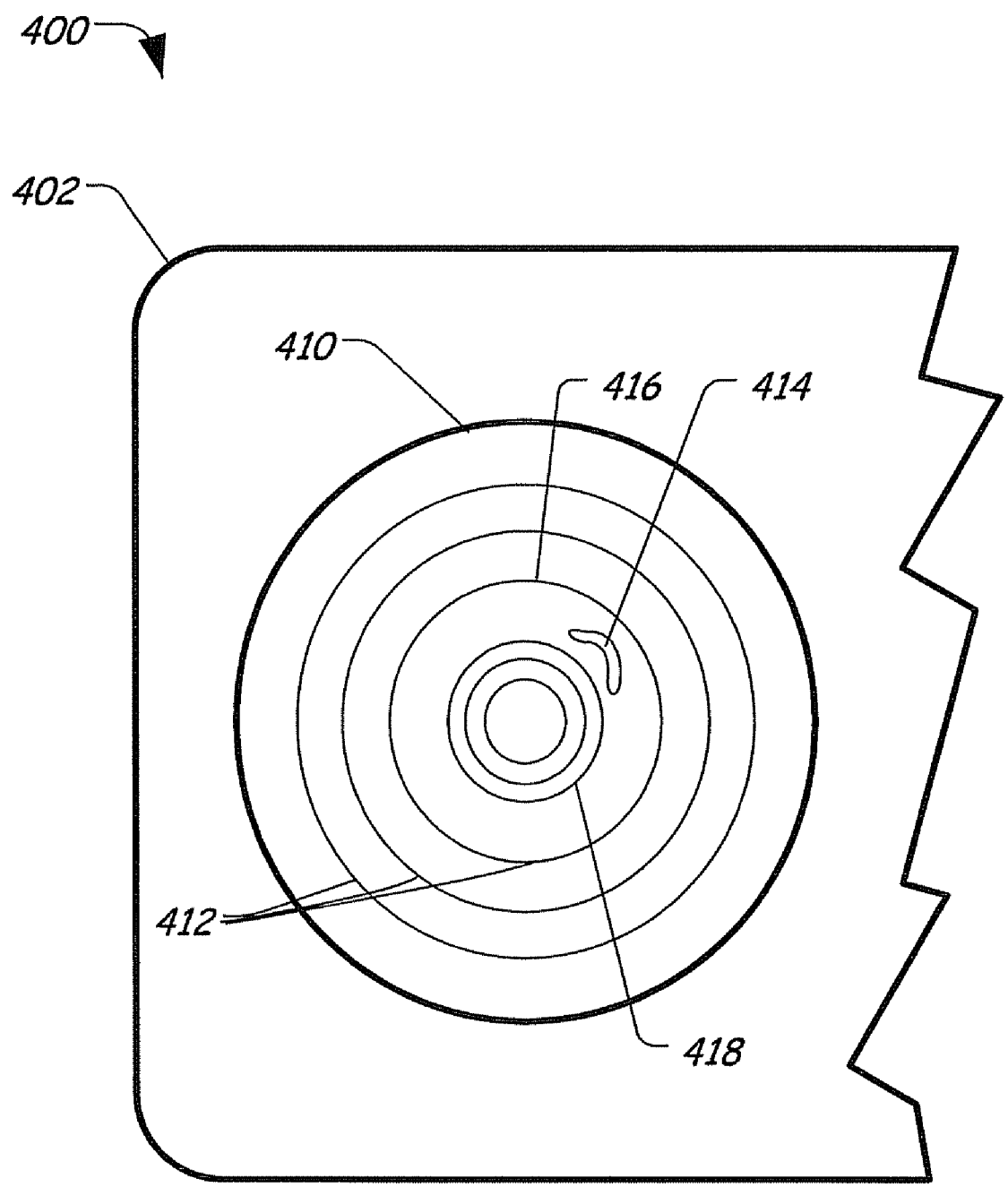
FIG. 4 is a bottom view of a particular illustrative embodiment of fluid cavity of a field device including a bean-shaped opening corresponding to a lumen of a capillary tube.

FIG. 4 is a bottom view of a particular illustrative embodiment of a fluid cavity 410 of a field device 400 including a bean-shaped opening 414 that corresponds to a bean-shaped lumen of an associated capillary tube. The fluid cavity 410 includes a plurality of ridges 412 to enhance accuracy of measurements derived from the deformation of the diaphragm. The fluid cavity 410 further includes a first ridge 416 and a second ridge 418. The bean-shaped opening 414 is formed between the first and second ridges 416 and 418. In a particular embodiment, the curvature and size dimensions of the bean-shaped opening 414 can prevent flames from traveling along a length of the corresponding capillary tube.

Figure 5:
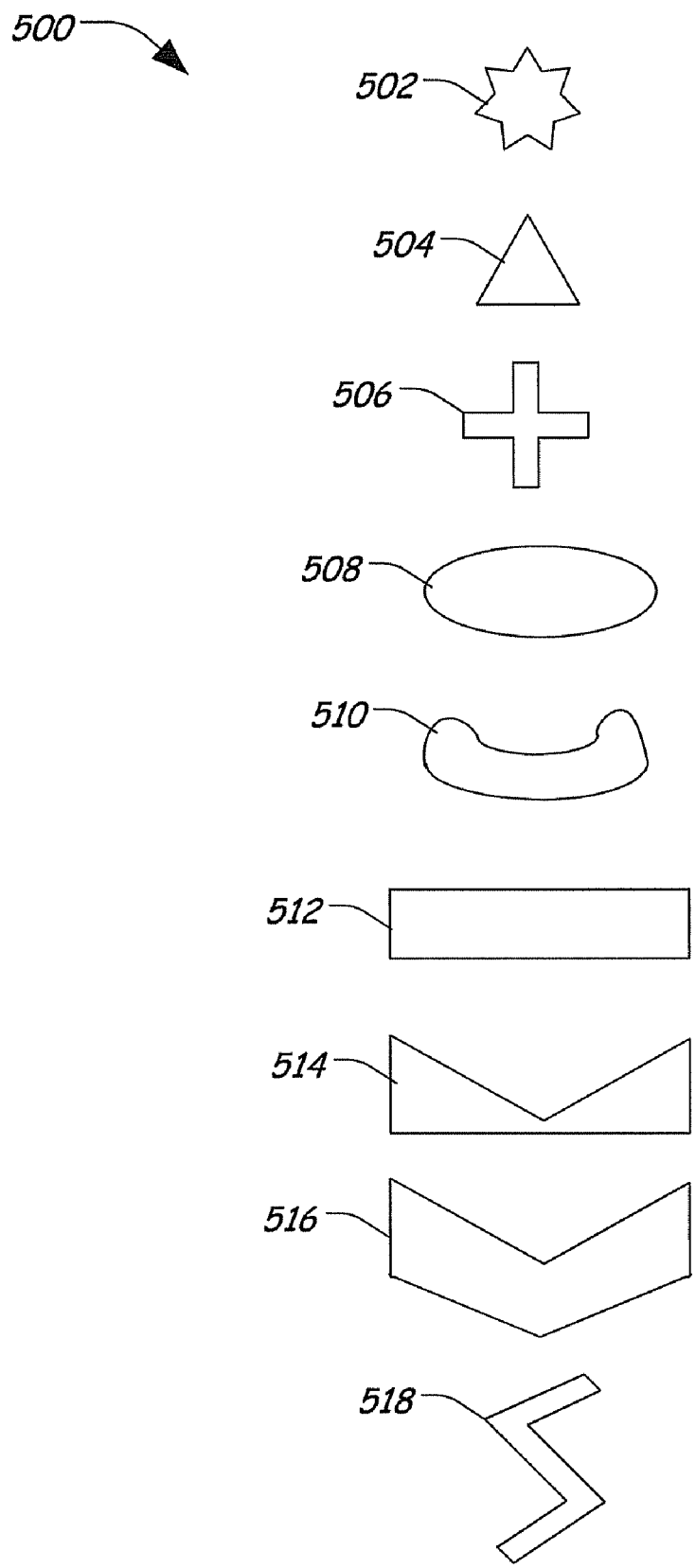
FIG. 5 is a diagram of a particular illustrative embodiment of various non-circular, cross-sectional lumen (i.e., non-cylindrical) shapes that may be used to define a non-cylindrical lumen of a capillary tube.

FIG. 5 is a diagram of a particular illustrative embodiment of various non-circular, cross-sectional lumen shapes 500 that may be used to define a non-cylindrical lumen of a capillary tube. In general, the shapes 500 may be used to reduce the ability of the flame to traverse a specific distance through the capillary tube. In the embodiment shown, the shapes 500 include a star shape 502, a triangle shape 504, a cross shape 506, an elliptical shape 508, a bean shape 510, a rectangular shape 512, another irregular shape 514, a boomerang shape 516, and an s-shape 518. In a particular embodiment, other non-cylindrical shapes may be used, such as a Z-shape, an H-shape, an L-shape, an X-shape, a V-shape, a U-shape, a zigzag shape, other shapes, or any combination thereof.

In a particular embodiment, the viscosity of the fill fluid may determine a cross-sectional area of the lumen of the capillary tube. For example, highly viscous oil may flow better within a lumen having a relatively larger cross-sectional area than within a capillary tube having a relatively smaller cross-sectional area. As the cross-sectional area of the lumen increases, the length of the capillary tube may also increase to maintain a ratio of capillary length (Lc) to cross-sectional area (A). In some instances, the ratio may vary based on the shape of the lumen, such that a V-shape or an S-shape may allow for a greater cross-sectional lumen area and a reduced capillary length while allowing the transmitter housing to meet flame-proof testing standards.

Figure 6:
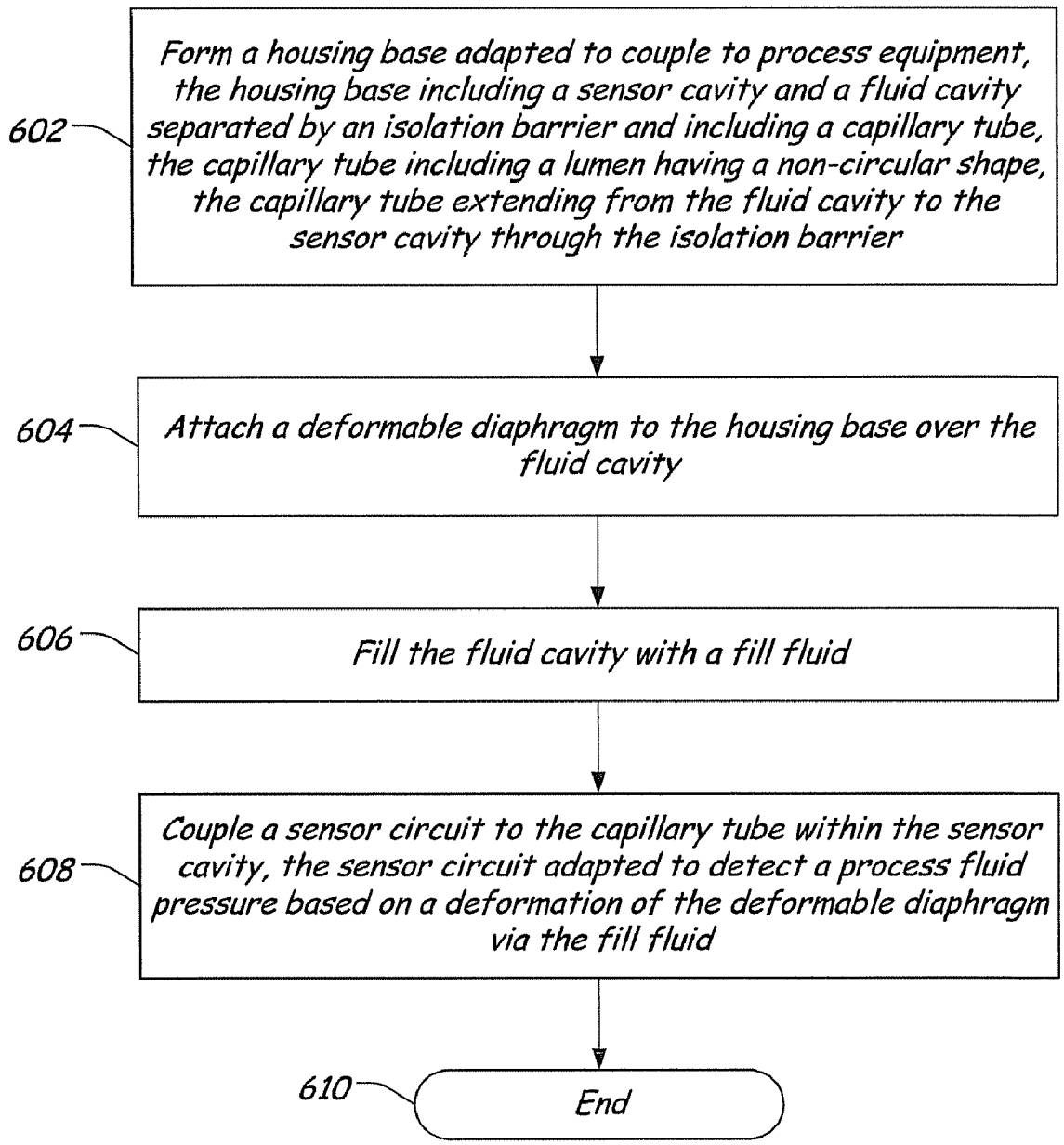
FIG. 6 is a flow diagram of a particular illustrative embodiment of a method of forming a field device including a capillary tube having a non-cylindrical lumen.

FIG. 6 is a flow diagram of a particular illustrative embodiment of a method of forming a field device including a capillary tube having a non-cylindrical lumen. At 602, a housing base adapted to couple to process equipment is formed. The housing base includes a sensor cavity and a fluid cavity separated by an isolation barrier. The housing base also includes a capillary tube that defines a lumen having a non-cylindrical shape. The capillary tube extends from the fluid cavity to the sensor cavity through the isolation barrier. In a particular illustrative embodiment, the non-cylindrical shape can be a cross shape, a bean shape, another irregular shape, or any combination thereof. Continuing to 604, a deformable diaphragm is attached to the housing base over the fluid cavity. Moving to 606, the fluid cavity is filled with a fill fluid. In a particular embodiment, the fill fluid comprises a substantially incompressible fluid. Proceeding to 608, a sensor circuit is coupled to the capillary tube within the sensor cavity, where the sensor circuit is adapted to detect a process fluid pressure based on a deformation of the deformable diaphragm via the fill fluid. In a particular embodiment, the sensor circuit is coupled to the housing base within the sensor cavity. The method terminates at 610.

In a particular embodiment, the capillary tube is adapted to prevent a flame from passing through the capillary tube from the sensor cavity. In another particular embodiment, the capillary tube defines a lumen that has a cross-sectional area (A) that is equal to or greater than approximately 0.00038 square inches. In a particular embodiment, a transmitter housing is coupled to the housing base, where the transmitter housing includes a communication interface and transmitter circuitry.

Although the present invention has been described with reference to preferred embodiments, workers skilled in the art will recognize that changes may be made in form and detail without departing from the spirit and scope of the invention.

What is claimed is:

1. A field device comprising:
   a housing defining a fluid cavity and a sensor cavity, the housing including an isolation barrier to isolate the fluid cavity from the sensor cavity;
   a pressure sensor disposed within the sensor cavity, the pressure sensor including at least one pressure inlet; and
   a capillary tube extending from the at least one pressure inlet to the fluid cavity through the isolation barrier, the capillary tube including a lumen having a non-cylindrical shape.

2. The field device of claim 1, further comprising:
   a diaphragm extending over the fluid cavity and having a first surface and a second surface, the diaphragm to contact a process fluid at the first surface and to deform in response to a process fluid pressure; and
   a fill fluid within the fluid cavity and the capillary tube and contacting the diaphragm at the second surface, the fill fluid adapted to convey the process fluid pressure to the at least one pressure inlet via the capillary tube in response to deformation of the diaphragm.

3. The device of claim 1, wherein a cross-sectional shape of the lumen comprises a substantially elliptical shape.

4. The device of claim 1, wherein a cross-sectional shape of the lumen comprises one of a bean-shape and a cross shape.

5. The device of claim 1, wherein a cross-sectional shape of the lumen comprises an S-shape.

6. The field device of claim 1, wherein the housing and the capillary tube are adapted to isolate the fluid cavity from flames.

7. The field device of claim 1, wherein the capillary tube has a cross-sectional area sized to permit free flow by the fill fluid while preventing flames from passing from the sensor cavity to the fluid cavity via the capillary tube.

8. The device of claim 7, wherein a ratio of the cross-sectional area of the lumen to a length dimension of the capillary tube is greater than or equal to approximately 0.58.

9. A method comprising:
   forming a housing base adapted to couple to process equipment, the housing base including a sensor cavity and a fluid cavity separated by an isolation barrier and including a capillary tube, the capillary tube including a lumen having a non-cylindrical shape, the capillary tube extending from the fluid cavity to the sensor cavity through the isolation barrier;
   attaching a deformable diaphragm to the housing base over the fluid cavity;
   filling the fluid cavity with a fill fluid; and
   coupling a sensor circuit to the capillary tube within the sensor cavity, the sensor circuit adapted to detect a process fluid pressure based on a deformation of the deformable diaphragm via the fill fluid.

10. The method of claim 9, wherein the fill fluid comprises a substantially incompressible fluid.

11. The method of claim 9, wherein the capillary tube is adapted to prevent a flame from passing through the capillary tube from the sensor cavity to the fluid cavity.

12. The method of claim 9, wherein a cross-sectional shape of the lumen comprises one of a cross shape and a bean shape.

13. The method of claim 9, wherein a cross-sectional shape of the lumen comprises one of an ellipse shape and a rectangular shape.

14. The method of claim 9, wherein the capillary tube defines a lumen having a cross-sectional area that is greater than or equal to approximately 0.00038 square inches.

15. The method of claim 14, further comprising attaching a transmitter housing to the housing base, the transmitter housing including a communication interface and transmitter circuitry adapted to communicate with a control system.

16. A field device to monitor a process fluid pressure, the field device comprising:
 a transmitter housing defining a sensor cavity and a fluid cavity separated from the sensor cavity by an isolation barrier;
 a capillary tube including a lumen having a non-cylindrical shape, the capillary tube extending from the fluid cavity to the sensor cavity through the isolation barrier and adapted to prevent a flame from traversing a length of the capillary tube;
 a deformable diaphragm coupled to the transmitter housing over the fluid cavity;
 a fill fluid disposed within the fluid cavity and the capillary tube; and
 a sensor circuit disposed within the sensor cavity, the sensor circuit coupled to the capillary tube to sense a process fluid pressure via the fill fluid based on deformation of the deformable diaphragm.

17. The process control device of claim 16, wherein the transmitter housing further defines a transmitter cavity and an interface cavity, the transmitter cavity and the interface cavity separated by a second isolation barrier and from the sensor cavity by a third isolation barrier.

18. The process control device of claim 17, further comprising:
 a communication interface disposed within the interface cavity and adapted to communicate with a control system; and
 a transmitter circuit disposed within the transmitter cavity, the transmitter circuit coupled to the sensor circuit to receive measurement data related to the process fluid pressure and coupled to the communication interface to transmit data related to the measurement data to the control system via the communication interface.

19. The process control device of claim 16, wherein the lumen has a cross-sectional width and a length parameter that prevent a flame from passing through the capillary tube.

20. The process control device of claim 16, wherein the non-cylindrical shape comprises one of a cross-shape, a bean shape, and an elliptical shape.

* * * * *